US 8,508,304 B2

(12) United States Patent
Ravinuthula

(10) Patent No.: US 8,508,304 B2
(45) Date of Patent: Aug. 13, 2013

(54) SERDES VCO WITH PHASED OUTPUTS DRIVING FREQUENCY TO VOLTAGE CONVERTER

(75) Inventor: Vishnu Ravinuthula, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/274,602

(22) Filed: Oct. 17, 2011

(65) Prior Publication Data

US 2013/0093526 A1 Apr. 18, 2013

(51) Int. Cl.
*H03K 3/03* (2006.01)
*H03L 1/00* (2006.01)
(52) U.S. Cl.
USPC ............... 331/57; 331/46; 331/47; 331/175
(58) Field of Classification Search
CPC ......... H03L 7/24; H03L 9/00; H03L 2207/08; H04L 7/0012; H04L 7/0083; H03M 9/00
USPC .................... 331/44, 47, 57, 60, 143, 177 R, 331/182, 183, 185, 186, 46, 176, 175, 2; 341/100, 101
See application file for complete search history.

(56) References Cited

U.S. PATENT DOCUMENTS 6,943,636 B2 * 9/2005 Moore ................... 331/117 FE
7,355,482 B2 * 4/2008 Meltzer ............................ 331/2
2006/0190880 A1 * 8/2006 Biesterfeldt et al. ............. 716/6
2007/0103242 A1 * 5/2007 Wu ................................ 331/57
2008/0122546 A1 * 5/2008 Shiramizu et al. ............. 331/34
2011/0227611 A1 * 9/2011 Yeh et al. ...................... 327/102

OTHER PUBLICATIONS

Stauffer, et al., High Speed Serdes Devices and Applications, Springer Science—Business Media, pp. iv, 1-2-9-10, 261-262-290-291, 368-369-369-370, 2008.
LatticeSC(TM) SERDES Jitter, Technical Note TN1084, Lattice Semiconductor Corporation, Mar. 2008.
Jerry C. Chen, Multi-Gigabit SerDes: The Cornerstone of High Speed Serial Interconnects, D&R Industry Articles, http://www.design-reuse.com/articles/10541/multi-gigabit-serdes-the-cornerstone-of-high-s . . . , downloaded Aug. 5, 2011.

* cited by examiner

*Primary Examiner* — Ryan Johnson
(74) *Attorney, Agent, or Firm* — Lawrence J. Bassuk; W. James Brady; Frederick J. Telecky, Jr.

(57) ABSTRACT

Reducing a gain of a VCO, which may be used in a serdes system, includes using an oscillator replicating the VCO. The oscillator frequency varies according to PVT conditions of circuit elements of the oscillator, which affect a speed of the circuit elements. A first circuit receives an output of the oscillator to produce a current that varies inversely proportionally to the oscillator frequency. A second circuit injects the current into a power supply line of the VCO. Thus, high VCO frequencies can be attained. By reducing the gain of the VCO, thermal noise contribution of the loop resistor and the loop capacitor required for desired loop bandwidth are reduced. During fast corner conditions, minimal current is injected into the VCO. During slow corner conditions, high current is injected into the VCO. These help keep VCTRL of the PLL loop close to a mid-rail operating region.

3 Claims, 4 Drawing Sheets

SERDES VCO WITH PHASED OUTPUTS DRIVING FREQUENCY TO VOLTAGE CONVERTER

FIELD

The various circuit embodiments described herein relate in general to ring oscillator phase locked loops (PLLs), and, more specifically, to PLLs, methods, and systems of the type described used to provide trigger signals to clock generators that may be used, for example, to clock "serdes" circuits, or the like.

BACKGROUND

The number of input and output pins on today's ever increasingly smaller integrated circuits is decreasing, while the available computing power is ever increasing, especially in modern microprocessors, microcontrollers, and the like. In addition, the quantity of data that is processed by these systems also is increasing. This has given rise to the development of so-called "serdes" devices.

"Serdes" is an acronym for a "serializer/deserializer" device. A serdes device receives an n-bit parallel data stream and converts it to a one-bit serial data stream for transmission over a serial transmission line, or channel, to a receiver. At the receiver, the device deserializes the serial data stream back to its original parallel form for use, for example in a processor, controller, or device requiring a parallel data input. The value of n may be any value greater than two; however, a value of 8 or 10 is typically be used for many coding protocols.

Also, although the term "device" is used to describe a single serdes device, it should be understood that serdes devices may comprise a plurality of separate chips, notably a transmitter and a receiver, with an interconnecting serial channel. The various chips, moreover, may reside or be embedded in different circuit elements, such as within a bus controller and a microcontroller, or the like. On the other hand, the various serdes device parts may be consolidated on a single chip, for example, when it is impractical to run a large data bus from one side of a chip to the other.

In order for the data to be properly converted from parallel data to serial data at the transmitting end, an accurate clock is required. In some serdes embodiments, the clock generator is driven by a phase-locked loop (PLL). One requirement of the PLL is that it delivers a high quality clock with minimal random jitter.

The PLLs typically employ a voltage-controlled oscillator (VCO) that must operate over a wide range of frequencies in order to meet demanding timing requirements of serdes devices. The speed of the transistors used in the VCO, however, may vary, depending on chip process, voltage, and temperature (PVT) conditions. All possible PVT variations from the ideal PVT conditions are often referred to as "corners," and the operation of the particular circuit under consideration under various PVT conditions is sometimes referred to as operation "within the corners." Thus, PLLs used in serdes devices need to support a wide range of frequencies over multiple corners. In cutting-edge silicon technologies, like 28 nm, this requires a very high VCO gain ($df_{VCO}/dV_{CTRL}$). However, reaching high PLL frequencies is difficult for slow corner conditions because the VCO will run slower than for fast corner conditions.

Large VCO gain increases the jitter contribution of the loop filter's resistance on the PLL output clock. Moreover, a PLL having a large VCO gain would require a large loop capacitor to provide the desired loop bandwidth with peaking of less than, for example, 1 dB.

What is needed is a method and circuit for reducing the VCO gain, $k_{VCO}$, thermal noise produced by the loop resistor, and the size of the loop capacitance required for a desired loop bandwidth with peaking of less than 1 dB. Also needed is a method and circuit that supports a high VCO frequency range. Additionally needed are circuit embodiments that are dynamic to adjust to changes in PVR conditions, including corners introduced by systematic and random variations of the transistors in the chip.

SUMMARY

The systems, circuits and methods described herein reduce the gain, $df_{VCO}/dV_{CTRL}$, of a ring oscillator by injecting a fixed current into the oscillator. This reduces $k_{VCO}$, the thermal noise contribution of the loop resistor which is multiplied by ($df_{VCO}/dV_{CTRL}$) before reaching the PLL output clock, and the loop capacitor required for desired loop bandwidth and peaking of less than 1 dB.

The fixed current injected into the ring oscillator is inversely proportional to the speed of the corners based on PVT conditions. During fast corner conditions, minimal current is injected into the ring oscillator. During slow corner conditions, high current is injected into the ring oscillator. These help keep $V_{CTRL}$ of the PLL loop close to a desirable mid-rail operating region.

In one embodiment, a method for controlling a gain of a VCO in a serdes system includes generating a current that is proportional to a speed of at least some circuitry of the serdes system, and injecting the current into a power supply line of the VCO. The speed of the at least some of the circuitry of the serdes system is based on chip process, voltage, and temperature (PVT) conditions of the circuitry. According to one aspect of the method, the magnitude of the injected current is inversely proportional to the speed of the circuitry of the serdes system.

In an embodiment of a serdes system, a VCO is included for providing clock pulses to at least a part of the serdes system. A replica oscillator replicates the VCO. A first circuit receives an output of the replica oscillator and produces a current that varies inversely proportionally to a frequency of the replica oscillator. A second circuit injects the current into a power supply line of the VCO. The frequency of the replica oscillator varies according to the influence of chip process, voltage, and temperature (PVT) conditions on the circuit elements of the replica oscillator, which affect the speed of the circuit elements.

The first circuit includes a frequency to voltage converter for receiving the output of the replica oscillator and producing a voltage output based on the frequency of the replica oscillator and a circuit for generating a current proportional the voltage output. The second circuit is a current mirror that is programmable based upon a desired speed the VCO.

In an embodiment of a circuit for controlling a gain of a VCO, a replica oscillator is included to replicate the VCO. A first circuit receives an output of the replica oscillator for producing a current that varies inversely proportionally to a frequency of the replica oscillator. A second circuit injects the current into a power supply line of the VCO. The frequency of the replica oscillator varies according to chip process, voltage, and temperature (PVT) conditions' effects on the circuit elements of the replica oscillator, which affects the speed of the circuit elements.

The first circuit includes a frequency to voltage converter for receiving the output of the replica oscillator and producing a voltage output based on the frequency of the replica oscillator and a circuit for generating a current proportional the voltage output. The second circuit is a current mirror that is programmable based upon a desired speed the VCO.

BRIEF DESCRIPTION OF THE DRAWINGS

In the various figures of the drawing, like reference numbers are used to denote like or similar parts.

DETAILED DESCRIPTION

Figure 1:
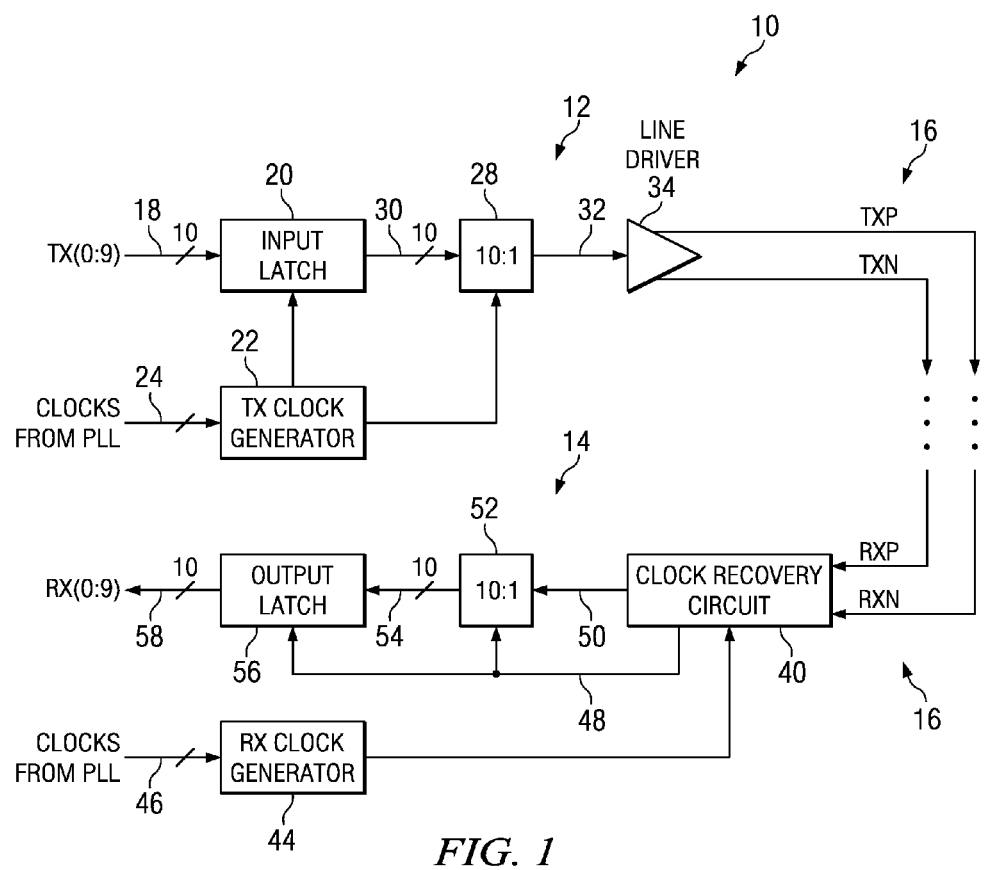
FIG. 1 is a simplified block diagram of an example of a serdes device of the type with which the PLL described herein may be used.

With reference first to FIG. 1, a simplified block diagram illustrates an example of a serdes device 10 of the type with which the PLL described herein may be used. The serdes device includes a transmitter section 12 and a receiver section 14, interconnected by a differential data channel 16. Although a differential data channel 16 is shown, it should be understood that a single ended data channel may be equally advantageously employed, either embodiment carrying a serial data signal between the transmitter section 12 and receiver section 14.

In the transmitter section 12, parallel data is conducted by a input bus 18 to an input latch 20. The parallel data on bus 18 may be, for example, 10 bits wide, although, as mentioned above, the parallel data may be of any width. The input latch 20 is controlled by clock signals from a transmitter clock generator 22. The input to the transmitter clock generator 22 is conducted on a bus 24 from the PLL clocks, as below described with reference to FIGS. 2 and 3.

The parallel data output from the input latch 20 is conducted to a parallel-to-serial converter 28, which converts the parallel data on its input line 30 to a serial data stream on its output line 32. The parallel-to-serial converter 28 also receives clock signals from the transmitter clock generator 22. The serial data stream on the output line 32 from the parallel-to-serial converter 28 is connected to a differential line driver 34, which produces the serial output signal, TXP and TXN, in the differential data channel 16.

In the receiver section 14, the serial output signal, TXP and TXN, in the differential data channel 16 is received on lines now denoted by RXP and RXN in a clock recovery circuit 40. In the embodiment illustrated, the clock recovery circuit 40 receives clock pulses from a receiver clock generator 44, which in turn, receives PLL clock pulses on an input bus 46. It should be understood that numerous clock recovery techniques exist, the embodiment shown in FIG. 1 being one illustrative example. The clock recovery circuit 40 produces a clock signal that is recovered from the received serial data. The clock signal from the clock recovery circuit 40 is delivered on line 48 to the other receiver components, next described.

The received serial data is conducted on line 50 from the clock recovery circuit 40 to a serial-to-parallel converter 52, which produces a parallel data output on line 54. The parallel data output on line 54 is latched in an output latch 56, the timing of which is controlled by the clock signal from the clock recovery circuit 40. Finally, the parallel data output from the output latch 56 is delivered on lines 58 for use in the circuitry (not shown) with which the serdes device 10 may be associated.

Figure 2:
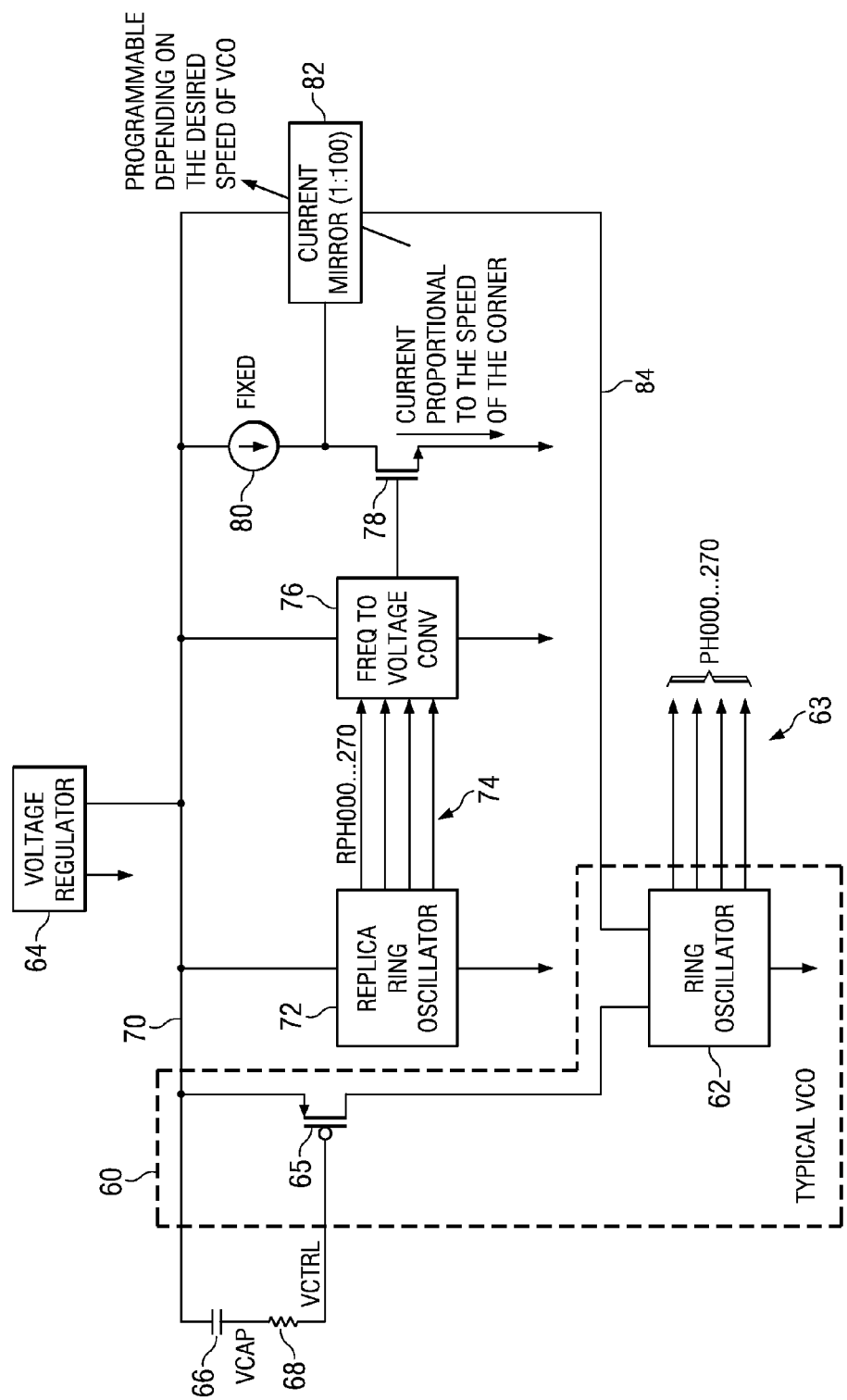
FIG. 2 is a block diagram of a VCO that may be used in conjunction with a serdes device of the type shown in FIG. 1, having a replica ring oscillator circuit, a frequency-to-voltage converter, and a current source for producing an injection current proportional to the corner speed at which the circuit is currently operating.
Figure 4A:
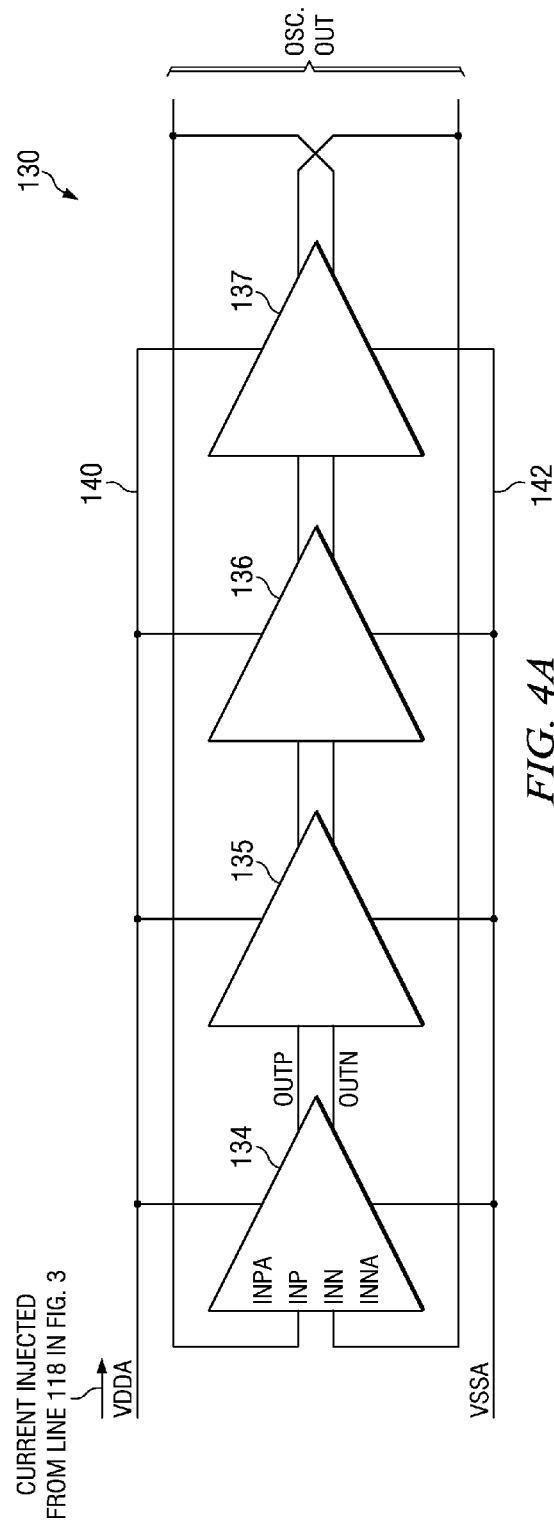
FIG. 4A is a block diagram of a typical VCO circuit with which the compensation scheme described herein may be employed.

Reference is now additionally made to FIG. 2, which is a block diagram of a VCO 60 that may be used in conjunction with a serdes device of the type shown in FIG. 1. The VCO 60 includes a ring oscillator 62, which may be of typical construction, as discussed in greater detail below conjunction with FIG. 4. The ring oscillator produces a number of output clock signals 63, denoted as PH000 . . . PH270, representing multi-phase outputs that toggle at the same frequency. The frequency of the VCO 62 is controlled by a PMOS device 65, in conjunction with the built in circuit delays of the elements of the VCO, which connects a regulated voltage from a voltage regulator 64 thereto, in known manner. A capacitor 66 and resistor 68 are connected between the supply voltage on line 70 to the gate of the PMOS device 65.

The VCO 60 includes a replica ring oscillator 72, which is of construction similar to that of the ring oscillator 62, except that the replica ring oscillator is free running and produces clock outputs 74, RPH000 . . . RPH270, at output frequencies that are influenced by the corners of the circuit with which the VCO 60 is associated. The replica ring oscillator is also operated by the voltage on line 70 from the voltage regulator 64.

The clock outputs 74 from the replica ring oscillator 72 are applied to a frequency-to-voltage converter 76, which is described in greater detail below with reference to FIG. 3. The frequency-to-voltage converter 76 also receives its supply voltage from the voltage regulator 64.

The output voltage from the frequency-to-voltage converter 76 is applied to the gate of an NMOS device 78. Thus, the current that flows through the NMOS device 78 is proportional to the speed of the circuit with which the VCO 60 is associated. The fixed current, $I_{FIXED}$, flows between the supply voltage on line 70 and the drain of the NMOS device 78. The difference in the current value of the fixed current, $I_{FIXED}$, and the current flowing through the NMOS device 78 is inversely proportional to the speed of the circuit with which the VCO 60 is associated. This current is mirrored in a current mirror 82 at a ratio that may be programmable depending on the desired speed of the VCO 60. In the example illustrated, for example, the ratio is shown to be 1:100. The current mirror serves as a current source to produce a current on line 84 that is injected into the ring oscillator 62 to adjust its output clock frequencies on line 63 according to the corners of the circuit.

Thus, for example, if the corner is a fast corner, the frequency produced by the replica ring oscillator is high, the voltage produced by the frequency-to-voltage converter 76 is high, the current flowing through the NMOS device 114 will be high, and the current difference between the fixed current, $I_{FIXED}$, and the current flowing through the NMOS device 114 will be low. The low current, mirrored into the ring oscillator 62 by the current mirror 82, will adjust the frequency of the ring oscillator. This is desired for fast corners because the VCO 60 should be able to hit high speeds with fast corners easily.

On the other hand, if the corner is a slow corner, the frequency produced by the replica ring oscillator is low, the voltage produced by the frequency-to-voltage converter 76 is low, the current flowing through the NMOS device 114 will be low, and the current difference between the fixed current, $I_{FIXED}$, and the current flowing through the NMOS device 114 will be high. The high current, mirrored into the ring oscillator 62 by the current mirror 82, will adjust the frequency of the ring oscillator. This is desired for slow corners because the VCO 60 would not be able to hit high speeds with slow corners, and high current injected by current mirror 82 into the VCO 60 would aid it to hit those speeds.

It can be seen that, in contrast to other programmable digital solutions, the circuit described above adapts to the settings of the silicon corners. Moreover, the techniques described herein support a high VCO frequency range. The circuitry described does not cause a large silicon area penalty or large $df_{VCO}/d_{VCTRL}$ (VCO gain) increase to hit high VCO speeds. Thus, VCO gain reduction helps to reduce the loop filter resistor's jitter contribution to the PLL output. The loop capacitor required for desired loop bandwidth and peaking of less than 1 dB is also reduced.

Since the programmable current injected into the ring oscillator 62 VCO is large for slow corners and small for fast corners, the $V_{CTRL}$ of the loop can be adjusted to mid-rail across corners and to a desirable operating point, depending on the desired output frequency.

Figure 3:
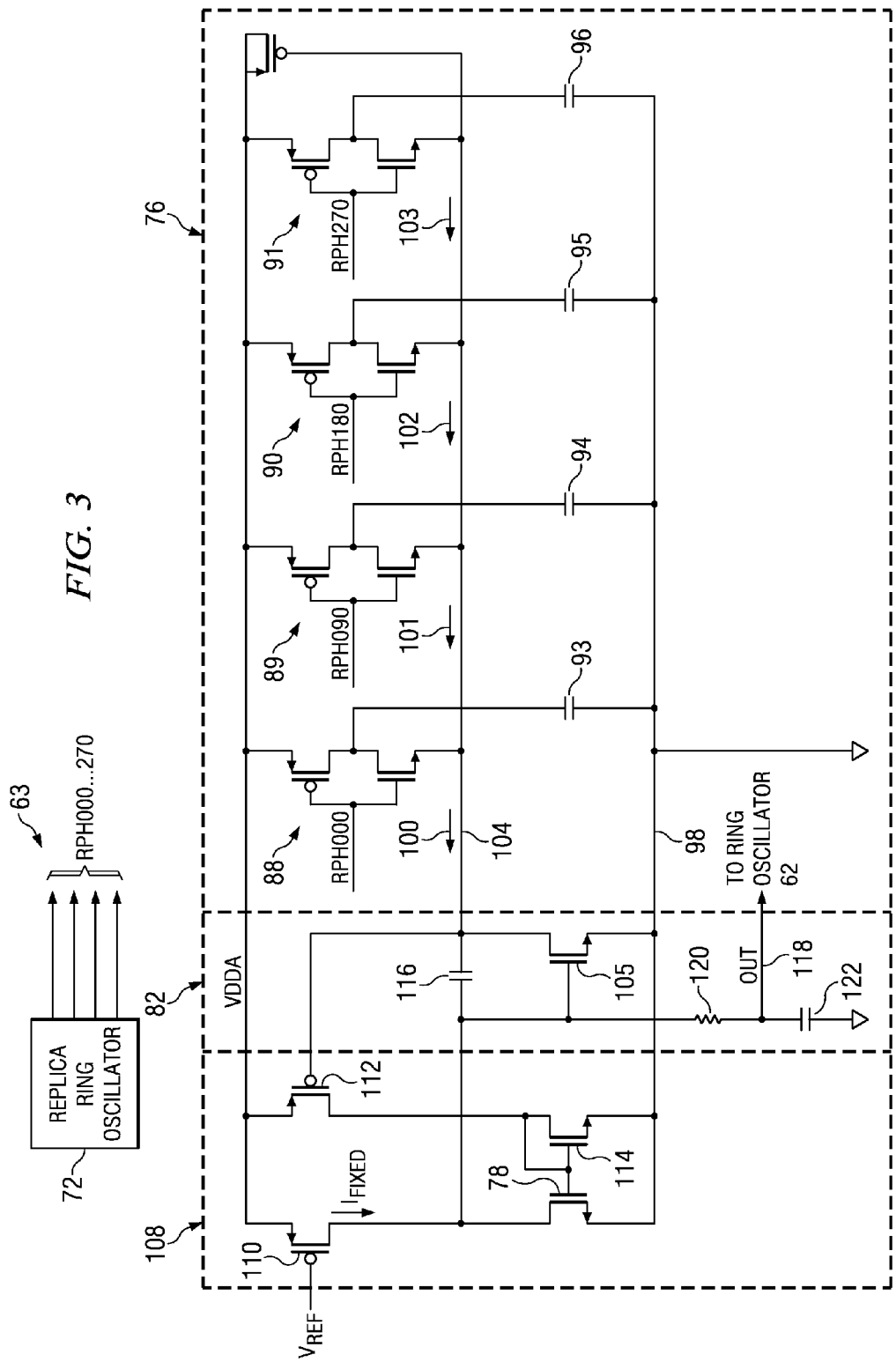
FIG. 3 is an electrical schematic drawing illustrating details of an embodiment of the replica ring oscillator circuit, the frequency voltage converter, and the current source of the block diagram of FIG. 2.

FIG. 3, to which reference is now additionally made, is an electrical schematic diagram illustrating details of an embodiment the frequency-to-voltage converter 76 and the current mirror 82 used in conjunction with the replica ring oscillator 72 of FIG. 2. The output signals RPH000 . . . RPH270 from the replica ring oscillator 72 are applied to the inputs of the string of inverters 88-91 of the frequency-to-voltage converter 76. The outputs of the inverters 88-91 develop voltages on respective capacitors 93-96, which are connected to a reference potential 98. Depending on the frequency of the signals RPH000 . . . RPH270, the currents 100-103 will vary, flowing through the NMOS device 105 to the reference potential 98 on line 104, thereby varying the voltage on the gate of transistor 105. This gate voltage is low pass filtered using resistor 120 and capacitor 122 and is taken as the output circuit 76.

The circuits 108 and 82 are the two stages of an operational amplifier. Circuit 108 is the first stage of the operational amplifier and has a reference circuit on one side including a PMOS device 110 in series with the NMOS device 78. The current flowing through the PMOS device 110 is $I_{FIXED}$, which is established by the reference voltage $V_{REF}$ applied to its gate, serving as a current source to the NMOS device 78. A second PMOS device 112 and NMOS device 114 are connected on the other side in parallel with the PMOS device 110 and NMOS device 78, with the gates of the NMOS devices being interconnected to each other and to the drain of the NMOS device 114. The gate of the PMOS device 112 is connected to the line 104.

The second stage of the operational amplifier has the NMOS device 105, the gate of which is connected to the drain of the NMOS device 78. The circuit output is delivered on output line 118, filtered by a resistor 120 and a capacitor 122. A capacitor 116 separates the gate terminal of device 105 from the line 104.

In operation, the currents 100-103 vary in accordance with variations in the corner operating conditions of the circuit with which the VCO is associated. If the signals RPH000-270 have high frequencies, the currents 100-103 will be high causing the gate voltage of the NMOS device 105 to increase with respect to the reference potential 98 on line 104 and hence the voltage output of circuit 76. On the other hand, if the signals RPH000-270 have low frequencies, the currents 100-103 will be low causing the gate voltage of the NMOS device 105 to decrease with respect to the reference potential 98 on line 104 and hence the voltage output of circuit 76.

Figure 4B:
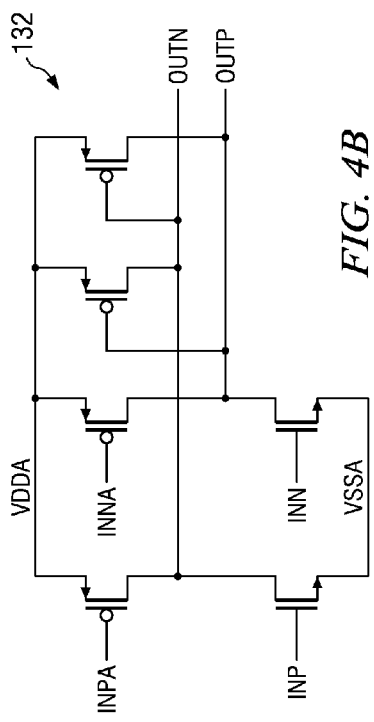
FIG. 4B is an example of one of the amplifier circuits of the VCO 130 shown in FIG. 4A.

A block diagram of a typical VCO circuit 130 with which the compensation scheme described above is shown in FIG. 4A, to which reference is now additionally made. In addition, an example of the circuitry of one of the amplifier circuits 132 of the VCO 130 is shown in FIG. 4B. In the embodiment shown, amplifiers 134 . . . 137 are connected end-to-end, with the output from the last amplifier 137 cross-coupled to the input of the first amplifier 134. The differential signal inputs to the first amplifier are denoted as INP, INN, and the differential outputs are denoted OUTP, OUTN.

The amplifiers 134 . . . 137 receive an input power supply voltage, VDDA, from a voltage source, not shown, on line 140, which is referenced to a reference potential, VSSA, on line 142. The output current of the current mirror 82 along with the output current of PMOS device 65 are injected into the input power supply line 140, as shown. This output current of current mirror 82 is inversely proportional to the speed of the corner (based on PVT conditions).

It should be noted that although the VCO embodiment 130 is illustrated as a string of amplifiers with a cross-coupled output feedback scheme, the principles described herein may be equally advantageously employed with other VCO designs, for example, an odd number of inverters with output connected to input, or the like.

Thus, by using the techniques described herein, the VCO gain, $df_{VCO}/dV_{CTRL}$, is reduced by injecting a fixed current into the power supply line of the ring oscillator. This reduces $k_{VCO}$, the thermal noise contribution of the loop resistor and the loop capacitor required for desired loop bandwidth and peaking of less than 1 dB. The fixed current injected into the ring oscillator is inversely proportional to the speed of the corners (based on PVT conditions). During fast corner conditions, minimal current is injected into the ring, and during slow corner conditions, high current is injected into the ring. These help keep $V_{CTRL}$ of the PLL loop close to a desirable mid-rail operating region.

Electrical connections, couplings, and connections have been described with respect to various devices or elements. The connections and couplings may be direct or indirect. A connection between a first and second electrical device may be a direct electrical connection or may be an indirect electrical connection. An indirect electrical connection may include interposed elements that may process the signals from the first electrical device to the second electrical device.

Although the invention has been described and illustrated with a certain degree of particularity, it should be understood that the present disclosure has been made by way of example only, and that numerous changes in the combination and arrangement of parts may be resorted to without departing from the spirit and scope of the invention, as hereinafter claimed.

The invention claimed is:
1. A serdes system, comprising:
   A. a voltage controlled oscillator including a ring oscillator having a power supply line and a reference supply line for providing clock pulses to at least a part of the serdes system;

B. a replica oscillator coupled between the power supply line and the reference supply line and having four, phased output lines;

C. a frequency to voltage converter coupled between the power supply line and the reference supply line and having four inverters, each inverter having an input coupled to one of the four, phased output lines of the replica oscillator, the inverters having outputs coupled together on one output line; and D. an operational amplifier having first and second stages that are coupled between the power supply line and the reference supply line and that are coupled together, the first stage having an input coupled to a reference voltage line, and the second stage having an input coupled to the one output line of the frequency to voltage converter and an output coupled to the power supply line of the voltage controlled oscillator.

2. The serdes system of claim 1 in which the operational amplifier includes a capacitor isolating the first stage from the second stage.

3. The serdes system of claim 1 in which the second stage of the operational amplifier is a current mirror.

\* \* \* \* \*